United States Patent
Lee et al.

(10) Patent No.: US 10,353,770 B2
(45) Date of Patent: Jul. 16, 2019

(54) MEMORY SYSTEM AND ERROR CORRECTING METHOD OF THE SAME

(71) Applicant: SK hynix Inc., Gyeonggi-do (KR)

(72) Inventors: Sung-Eun Lee, Gyeonggi-do (KR); Jung-Hyun Kwon, Seoul (KR); Sang-Gu Jo, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 15/826,808

(22) Filed: Nov. 30, 2017

(65) Prior Publication Data

US 2018/0165151 A1    Jun. 14, 2018

(30) Foreign Application Priority Data

Dec. 14, 2016    (KR) .................. 10-2016-0170454

(51) Int. Cl.
*G06F 3/06*    (2006.01)
*G06F 11/10*    (2006.01)
*G11C 29/02*    (2006.01)
*G11C 29/42*    (2006.01)
*G11C 29/52*    (2006.01)
(Continued)

(52) U.S. Cl.
CPC ........ *G06F 11/1028* (2013.01); *G06F 3/0679* (2013.01); *G06F 11/108* (2013.01); *G06F 11/1048* (2013.01); *G11C 29/02* (2013.01); *G11C 29/42* (2013.01); *G11C 29/52* (2013.01); *H03M 13/15* (2013.01);
(Continued)

(58) Field of Classification Search
CPC ........ G06F 11/1028; G06F 11/10; G06F 3/06; G06F 11/1048; G06F 3/0679; G11C 29/02; G11C 29/42; G11C 29/52; H03M 13/15; H03M 13/29; H03M 13/152; H03M 13/1515; H03M 13/2957

See application file for complete search history.

(56) References Cited

U.S. PATENT DOCUMENTS 6,272,659 B1 *  8/2001  Zook ................. H03M 13/1515
                                                    714/763
6,370,668 B1 *  4/2002  Garrett, Jr. .......... G06F 11/1028
                                                    714/710
(Continued)

FOREIGN PATENT DOCUMENTS

KR    1020140074600    6/2014

OTHER PUBLICATIONS

H. Chen et al., "Using Low Cost Erasure and Error Correction Schemes to Improve Reliability of Commodity DRAM Systems," in IEEE Transactions on Computers, vol. 65, No. 12, pp. 3766-3779, Dec. 1, 2016.*

*Primary Examiner* — Cynthia Britt
(74) *Attorney, Agent, or Firm* — IP & T Group LLP

(57) ABSTRACT

An error correcting method of a memory system includes: reading data and an error correction code from a plurality of memory chips; correcting an error of the data based on the error correction code; determining whether or not a miscorrection occurs in the correcting of the error of the data; designating one memory chip among the plurality of the memory chips as a chip-killed memory chip when a miscorrection occurs; re-correcting the error of the data based on the error correction code in consideration of the designated chip-killed memory chip; and re-determining whether a miscorrection occurs in the re-correcting of the error of the data.

11 Claims, 4 Drawing Sheets

(51) Int. Cl.
*H03M 13/15* (2006.01)
*H03M 13/29* (2006.01)

(52) U.S. Cl.
CPC ...... *H03M 13/152* (2013.01); *H03M 13/1515* (2013.01); *H03M 13/2957* (2013.01)

(56) References Cited

U.S. PATENT DOCUMENTS

| | | | |
|---|---|---|---|
| 6,691,276 B2 | 2/2004 | Holman | |
| 8,171,377 B2* | 5/2012 | Dell | G06F 11/1044 |
| | | | 714/756 |
| 2005/0060630 A1* | 3/2005 | Hassner | G11B 20/1866 |
| | | | 714/758 |
| 2010/0287436 A1* | 11/2010 | Lastras-Montano | |
| | | | G06F 11/1044 |
| | | | 714/752 |
| 2010/0293437 A1* | 11/2010 | Gollub | G06F 11/1048 |
| | | | 714/763 |
| 2010/0299576 A1* | 11/2010 | Baysah | G06F 11/1044 |
| | | | 714/763 |
| 2011/0320911 A1* | 12/2011 | Fry | G06F 11/1048 |
| | | | 714/758 |
| 2014/0164866 A1* | 6/2014 | Bolotov | H03M 13/1111 |
| | | | 714/758 |
| 2014/0351672 A1* | 11/2014 | Marrow | H03M 13/152 |
| | | | 714/764 |
| 2016/0350181 A1* | 12/2016 | Cha | G06F 11/1068 |
| 2016/0378596 A1* | 12/2016 | Kim | G06F 11/1012 |
| | | | 714/755 |
| 2017/0063394 A1* | 3/2017 | Halbert | G06F 11/1068 |

* cited by examiner

```
         01101101 ⎫              01101101 ⎫              01101101 ⎫
         01111111 ⎪              01111111 ⎪              01111111 ⎪
         11000110 ⎪              11000110 ⎪              11000110 ⎪
         10100000 ⎬ DATA          10100000 ⎬ DATA          10100000 ⎬ DATA
         00001010 ⎪ 64symbols    00001010 ⎪ 64symbols    00001010 ⎪ 64symbols
         10100011 ⎪              10100011 ⎪              10100011 ⎪
         11011010 ⎪              11011010 ⎪              11011010 ⎪
            ⋮     ⎭                 ⋮     ⎭              10010101 ⎭
                                 11010100
XOR      11010100                              XOR      1̄1010011̄ – MIS_DET
         ──────────              XOR      11010011 – MIS_DET       ──────────
         11010011 – MIS_DET      ──────────              01000001
                                 00000000                ALARM = 1
                                 ALARM = 0
           (a)                     (b)                     (c)
```

MEMORY SYSTEM AND ERROR CORRECTING METHOD OF THE SAME

CROSS-REFERENCE TO RELATED APPLICATIONS

The present application claims priority of Korean Patent Application No. 10-2016-0170454, filed on Dec. 14, 2016, which is incorporated herein by reference in its entirety.

BACKGROUND

1. Field

Exemplary embodiments of the present invention relate to a memory system.

2. Description of the Related Art

In the early stage of a semiconductor memory device industry, there were many originally good dies on the wafers, which means that memory chips were produced with no defective memory cells through a semiconductor fabrication process. However, as the capacity of memory devices increases, it becomes difficult to fabricate a memory device that does not have any defective memory cells, and nowadays, it may be said that there is substantially no chance that a memory device is fabricated without any defective memory cells.

To address such limitations, a repair method is used which includes adding redundancy memory cells in a memory device and replacing any defective memory cells with the redundancy memory cells.

Another solution employs an error correction circuit (ECC) for correcting errors in a memory system. Typically, an ECC may correct an error that occurs because of a defective memory cell and also an error that occurs in the transmission of data in a read or a write operation of a memory system.

SUMMARY

Embodiments of the present invention are directed to a technology for increasing error correction efficiency in a memory system. More specifically, the present invention is directed to an improved error correction method and a memory system employing the method.

In accordance with an embodiment of the present invention, an error correcting method of a memory system includes: reading data and an error correction code from a plurality of memory chips; correcting an error of the data based on the error correction code; determining whether or not a miscorrection occurs in the correcting of the error of the data; designating one memory chip among the plurality of the memory chips as a chip-killed memory chip when a miscorrection occurs; re-correcting the error of the data based on the error correction code in consideration of the designated chip-killed memory chip; and re-determining whether a miscorrection occurs in the re-correcting of the error of the data.

When a miscorrection is detected in the re-determining of whether the miscorrection occurs or not, the memory chip that is designated as the chip-killed memory chip among the plurality of the memory chips is changed with another memory chip, and then the re-correcting of the error of the data and the re-determining of whether the miscorrection occurs are repeated.

The method may further comprise when a miscorrection is not detected in the deciding of whether the miscorrection occurs or not, ending the error correcting process.

The method may further comprise when a miscorrection is not detected in the re-determining of whether the miscorrection occurs or not, determining the memory chip, that is designated as the designated chip-killed memory chip, as a chip-killed memory chip, and ending an error correcting process.

The method may further comprise reading a miscorrection detecting code from the plurality of memory chips, and wherein the deciding of whether the miscorrection occurs or not and the re-deciding of whether the miscorrection occurs or not are performed based on the miscorrection detecting code.

The error correction code may include one of an error correction code of a Reed Solomon (RS) scheme, an error correction code of a Bose-Chaudhuri-Hocquenghem (BCH) scheme and an error correction code of a Turbo scheme.

In accordance with another embodiment of the present invention, a memory system includes: a plurality of memory chips suitable for storing data and an error correction code; an error correction circuit suitable for reading the data and the error correction code from the plurality of the memory chips, and correcting an error of the data based on the error correction code; and a miscorrection detecting circuit suitable for detecting whether a miscorrection occurs or not in the error correction circuit, wherein when the miscorrection detecting circuit detects a miscorrection of the error correction circuit, the error correction circuit designates one memory chip among the plurality of the memory chips as a chip-killed memory chip and re-corrects the error of the data based on the error correction code in consideration of the designated chip-killed memory chip.

The error correction circuit may perform an error correcting operation repeatedly by changing the memory chip which is designated as the chip-killed memory chip with another memory chip among the plurality of the memory chips, until no miscorrection is detected.

The plurality of the memory chips may further store a miscorrection detecting code, and the miscorrection detecting circuit may detect a miscorrection of the error correction circuit based on the miscorrection detecting code.

The error correction circuit may include one of an error correction code of a Reed Solomon (RS) scheme, an error correction code of a Bose-Chaudhuri-Hocquenghem (BCH) scheme and an error correction code of a Turbo algorithm.

The error correction circuit may designate a particular memory chip among the plurality of the memory chips as a chip-killed memory chip and, when no miscorrection is detected, decides the particular memory chip as a chip-killed memory chip.

The error correction circuit and the miscorrection detecting circuit may be included in a memory controller, and the plurality of the memory chips may be included in a memory module.

The memory system may be capable of correcting errors in a case that N random errors (where N is an integer equal to or greater than '1') occur in the plurality of the memory chips and one memory chip among the plurality of the memory chips is a chip-killed memory chip. And the number of bits of the error correction code used in the memory system may be less than the number of bits of the error correction code required to correct the errors in the case that N random errors (where N is an integer equal to or greater than '1') occur in the plurality of the memory chips and one memory chip among the plurality of the memory chips is the chip-killed memory chip, without the memory system designating one memory chip among the plurality of the memory chips as a chip-killed memory chip

DETAILED DESCRIPTION

Figure 1:
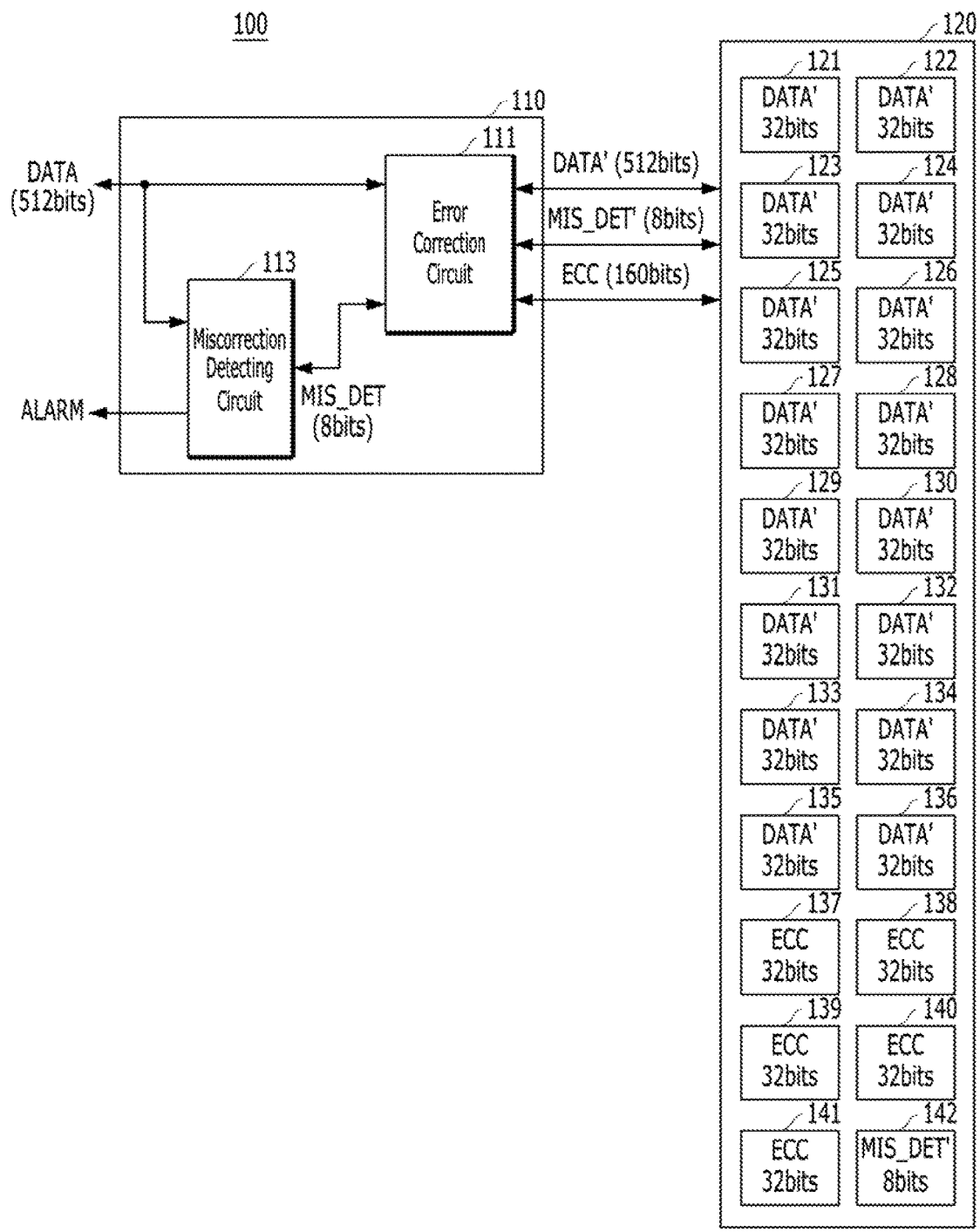
FIG. 1 is a block diagram illustrating a memory system, in accordance with an embodiment of the present invention.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

FIG. 1 is a block diagram illustrating a memory system 100, in accordance with an embodiment of the present invention. FIG. 1 shows only a portion of the memory system that is directly related to the transfer of data in the memory system 100.

Referring to FIG. 1, the memory system 100 may include a memory controller 110 operatively coupled to a memory module 120. The memory controller 110 may control the operation of the memory module 120, for example, the memory controller 110 may control the read and write operations of the memory module 120, upon the receipt of corresponding read and write requests from an external device such as a host (not shown).

The memory controller 110 may include an error correction circuit 111 and a miscorrection detecting circuit 113.

The miscorrection detecting circuit 113 may generate a miscorrection detecting code MIS_DET during a write operation. The miscorrection detecting code MIS_DET is a code for verifying whether the error correcting operation of the error correction circuit 111 is performed correctly during a read operation. The miscorrection detecting circuit 113 can verify whether a read data DATA which is corrected by the error correction circuit 111 by using the miscorrection detecting code MIS_DET during a read operation is corrected correctly or not. When there is an error in the read data DATA that is corrected by the error correction circuit 111, the miscorrection detecting circuit 113 enables and generates an alarm signal ALARM indicating the presence of the error in the read data DATA. The alarm signal ALARM is then transferred to the host.

Figures 2, 3:
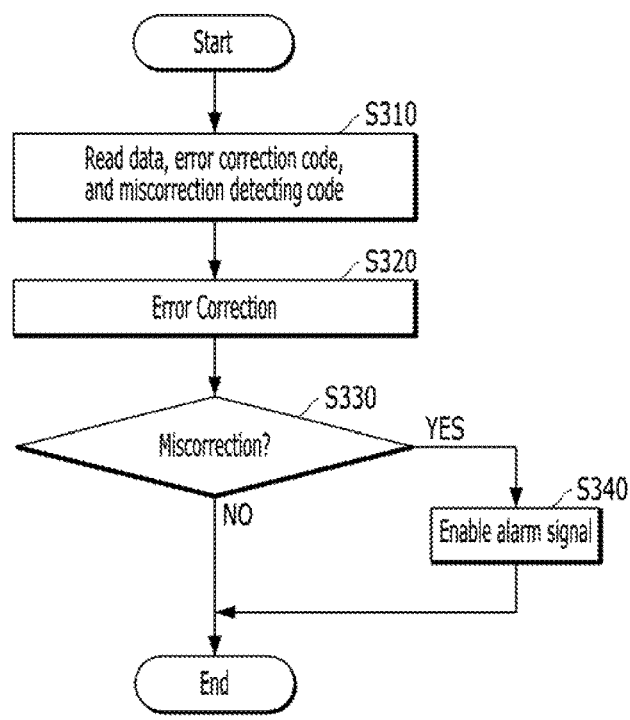
FIG. 2 illustrates a process of generating a miscorrection detecting code and a process of detecting a miscorrection by using the miscorrection detecting code, in accordance with an embodiment of the present invention.
FIG. 3 is a flowchart illustrating an error correcting method in a memory system, in accordance with an embodiment of the present invention.

In operation, the miscorrection detecting circuit 113 may receive a write data DATA from the host during a write operation and generate the miscorrection detecting code MIS_DET for the write data DATA. In some embodiments, the miscorrection detecting circuit 113 may perform an XOR operation on the write data DATA during the write operation and generate the miscorrection detecting code MIS_DET. The write data DATA may include 512 bits and when it is assumed that '1 symbol' is 8 bits (1 symbol=8 bits), the write data DATA may include 64 symbols. The miscorrection detecting circuit 113 may perform an XOR operation on the 64 symbols and generate a miscorrection detecting code MIS_DET of one symbol (i.e., 8 bits). In FIG. 2, which illustrates a process of generating a miscorrection detecting code MIS_DET and a process of detecting a miscorrection by using the miscorrection detecting code MIS_DET, (a) shows a process of generating the miscorrection detecting code MIS_DET by performing an XOR operation on the 64 symbols of the write data DATA.

The miscorrection detecting circuit 113 may detect a miscorrection of the error correction circuit 111 by performing an XOR operation. In some embodiments, the miscorrection detecting circuit 113 may perform an XOR operation on a read data DATA whose error is corrected by the error correction circuit 111 and the miscorrection detecting code MIS_DET whose error is corrected by the error correction circuit 111 during a read operation, and detect a miscorrection of the error correction circuit 111. If the result of performing the XOR operation on the error-corrected read data DATA and the error-corrected miscorrection detecting code MIS_DET is '00000000', it may be decided that error correction is performed correctly. Otherwise, if there is at least one '1' in the result of performing the XOR operation, it is decided that error correction is not performed correctly and thus the alarm signal ALARM is enabled and generated. The alarm signal ALARM may be transferred to the host. In FIG. 2, (b) represents a process of performing an XOR operation on the 64 symbols of the error-corrected read data DATA and the error-corrected miscorrection detecting code MIS_DET and verifying whether there is a miscorrection or not. In the (b) of FIG. 2, it is illustrated that the result of performing the XOR operation is '00000000', and no miscorrection is detected. In FIG. 2, (c) represents a process of performing an XOR operation on the 64 symbols of the error-corrected read data DATA and the error-corrected miscorrection detecting code MIS_DET and verifying whether there is a miscorrection or not. In the (c) of FIG. 2, it is illustrated that the result of performing the XOR operation includes at least one '1', there is a miscorrection in the 64 symbols of the error-corrected read data DATA and the miscorrection is detected.

The error correction circuit 111 may preferably use an error correcting algorithm of a Reed Solomon (RS) scheme. A Hamming scheme may be used, however, as more errors occur in a plurality of memory chips 121 to 142 included in the memory module 120, the error correcting algorithm of the RS scheme, which has a stronger error correction capability than the error correcting algorithm of the hamming scheme, may be used preferably. However, it is noted that the error correction circuit 111 may also use other error correcting algorithms such as the Bose-Chaudhuri-Hocquenghem (BCH) scheme, and the Turbo scheme.

The error correction circuit 111 may generate an error correction code ECC for correcting an error by using the write data DATA received from the host during a write operation and the miscorrection detecting code MIS_DET generated in the miscorrection detecting circuit 113. During the write operation, the write data DATA transferred from the host to the error correction circuit 111 may be the same as a write data DATA' transferred from the error correction circuit 111 to the memory module 120, and the miscorrection detecting code MIS_DET transferred from the miscorrection detecting circuit 113 to the error correction circuit 111 may be the same as a miscorrection detecting code MIS_DET' transferred from the error correction circuit 111 to the memory module 120.

The error correction circuit 111 may correct an error of a read data DATA' that is read from the memory module 120 and the miscorrection detecting code MIS_DET' that is read from the memory module 120 by using the error correction code ECC that is read from the memory module 120 during a read operation. The error correction circuit 111 may transfer the error-corrected read data DATA to the host and the miscorrection detecting circuit 113, and transfer the error-corrected miscorrection detecting code MIS_DET to the miscorrection detecting circuit 113.

The unit of data processed in most memory systems may be, for example, 512 bits. In other words, the write data DATA transferred from the host to the memory controller 110 and the read data DATA transferred from the memory controller 110 to the host may be 512 bits. If the coverage of error correction required by a memory system is as much as correcting 6 bits of random errors and one chip-killed memory chip, the RS algorithm may be able to correct errors of a total of 10 symbols, which include 6 symbols (a case where 6-bit random errors belong to different symbols is assumed) and 4 symbols (a 32-bit data error of one chip-killed memory chip), because an error is corrected on the basis of a symbol. In the RS algorithm, the number of parity bits, which is the size of the error correction code ECC, may be decided based on the number of error-correctable symbols. This is shown in the following Equation 1.

Parity bits=2*(Number of error-correctable symbols) (1)

The size of the parity bits when 10 symbols may be corrected based on Equation 1 may be calculated to be 160 bits, which is 2*10 symbols=20 symbols=20*8 bits. In short, the number of bits of the error correction code ECC which is capable of correcting 6 bits of random errors and one chip-killed memory chip in memory chips may be 160 bits, which is shown in FIG. 1.

The memory module 120 may include a plurality of memory chips, for example, 22 memory chips 121-142. Each of the memory chips 121 to 142 may be one among all kinds of memories, such as Dynamic Random Access Memory (DRAM), Phase-Change RAM (PCRAM), flash memory and the like. The memory module 120 may be a Dual In-Line Memory Module (DIMM). Each of the memory chips 121 to 142 may be able to store data of 32 bits during a one-time write operation, and output data of 32 bits during a one-time read operation. In 16 memory chips 121 to 136, data DATA' of 512 bits may be written and read, and in the other five memory chips 137 to 141, an error correction code ECC of 160 bits may be written and read. In the memory chip 142, an 8-bit miscorrection detecting code MIS_DET' may be written and read. In all the remaining 24 bits of the memory chip 142, '0' may be written and read. In short, the remaining 24 bits of the memory chip 142 may be zero-padded. In the memory chips 121 to 142 of FIG. 1, the information stored in the memory chips 121 to 142 is shown. The pattern that data DATA', the error correction code ECC, and the miscorrection detecting code MIS_DET' are distributed to the memory chips 121 to 142 does not have to be the same as the pattern shown in FIG. 1. The data DATA', the error correction code ECC, and the miscorrection detecting code MIS_DET' may be distributed to the memory chips 121 to 142 and stored therein.

Although FIG. 1 shows an example where the error correction circuit 111 and the miscorrection detecting circuit 113 are included in the memory controller 110, at least a part of them may be included in the memory module 120. Also, as it should be obvious to those skilled in the art, it is noted that the number of the memory chips that are included in the memory module 120 may be different from what is shown in FIG. 1, and the numbers of the bits of the data DATA', the error correction code ECC, and the miscorrection detecting code MIS_DET may be different from what is shown in FIG. 1.

Also, although FIG. 1 shows an example where 1 symbol is formed of 8 bits, it is obvious to those skilled in the art that when 1 symbol is not formed of 8 bits, for example, when 1 symbol is formed of 7 bits or 6 bits, the number of bits of the error correction code ECC and the number of bits of the miscorrection detecting code MIS_DET may be different from what is shown in FIG. 1.

FIG. 3 is a flowchart illustrating an error correcting method in a memory system in accordance with an embodiment of the present disclosure, for example, in the memory system 100 shown in FIG. 1.

Referring to FIG. 3, in step S310, the data DATA', the error correction code ECC, and the miscorrection detecting code MIS_DET' may be read from the memory chips 121 to 142. The read data DATA', error correction code ECC, and miscorrection detecting code MIS_DET' may be transferred to the memory controller 110.

In step S320, the error correction circuit 111 may correct errors in the data DATA' and the miscorrection detecting code MIS_DET' by using the error correction code ECC. The error correction circuit 111 may transfer the error-corrected data DATA to the host and the miscorrection detecting circuit 113, and transfer the error-corrected miscorrection detecting code MIS_DET to the miscorrection detecting circuit 113.

In step S330, the miscorrection detecting circuit 113 may detect whether or not there is a miscorrection in the data by using the miscorrection detecting code MIS_DET. If the number of errors occurring in the memory chips 121 to 142 is more than the error correction capacity of the error correction circuit 111, for example, if errors of more than 6 bits of random errors and one chip-killed memory chip occur, the error correction circuit 111 may not correct the errors correctly and may, therefore, make a miscorrection. The miscorrection detecting circuit 113 may then detect the miscorrection.

When no miscorrection is detected ('No' in the step S330), the error correcting process may be finished.

When a miscorrection is detected ('Yes' in the step S330), the miscorrection detecting circuit 113 may enable and generate the alarm signal ALARM indicating that there is an error in the data DATA in step S340. The alarm signal ALARM may be transmitted to the host. The error correcting process may then be finished.

Figure 4:
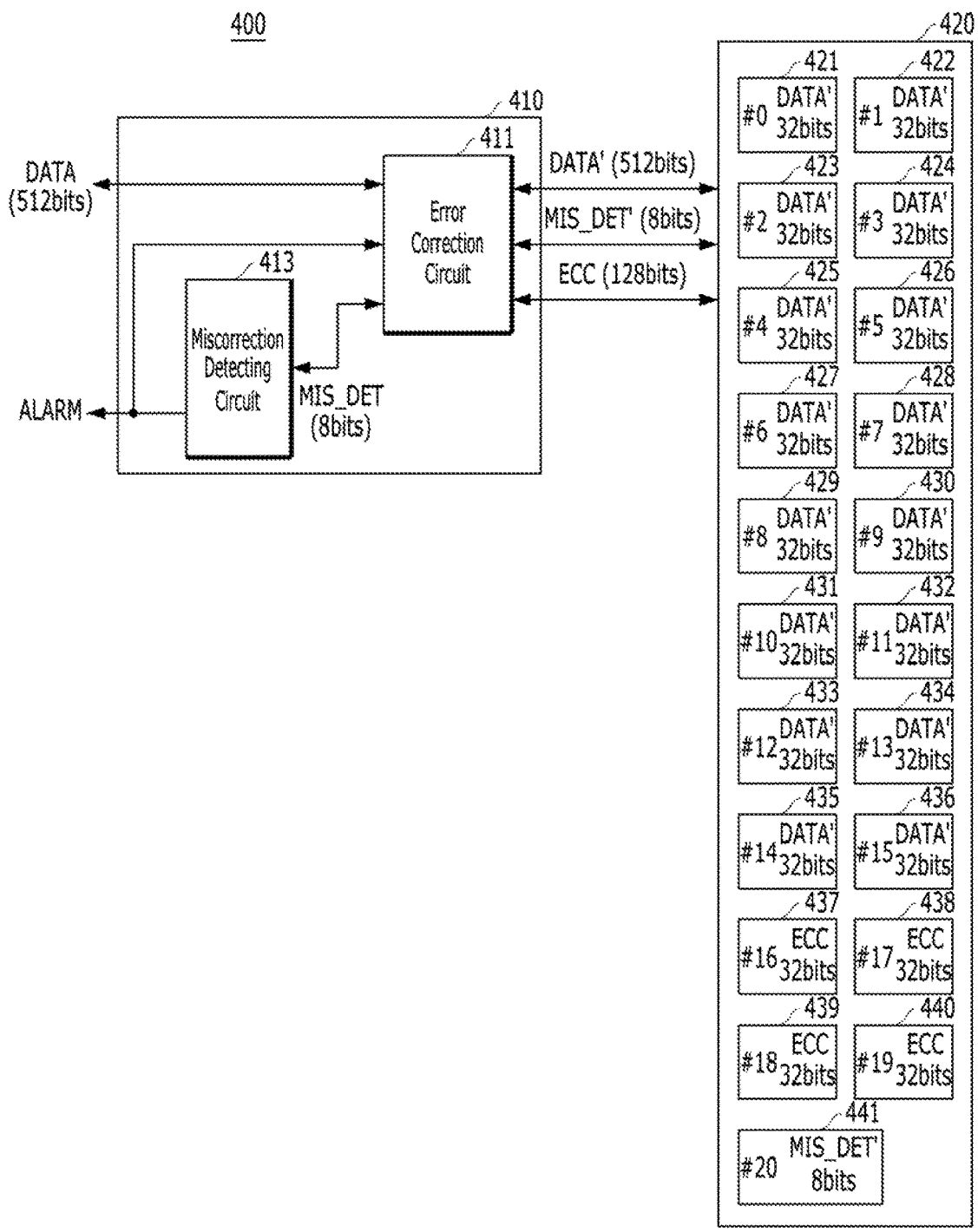
FIG. 4 is a block diagram illustrating a memory system, in accordance with an embodiment of the present invention.

FIG. 4 is a block diagram illustrating a memory system 400 in accordance with another embodiment of the present invention. FIG. 4 shows only a portion of the memory system 400 that is directly related to the transfer of data in the memory system 400.

Referring to FIG. 4, the memory system 400 may include a memory controller 410 operatively coupled to a memory module 420. The memory controller 410 may control the operations of the memory module 420 including for example the read and write operations of the memory module 420, upon the receipt of corresponding read and write requests from an external device such as a host (not shown).

The memory controller 410 may include an error correction circuit 411 and a miscorrection detecting circuit 413.

The miscorrection detecting circuit 413 may generate a miscorrection detecting code MIS_DET during a write operation. The miscorrection detecting code MIS_DET may be a code for verifying whether the error correcting operation of the error correction circuit 411 is performed correctly during a read operation. The miscorrection detecting circuit 413 may verify whether a read data DATA which is corrected by the error correction circuit 411 by using the miscorrection detecting code MIS_DET during a read operation is corrected correctly. When there is an error in the read data DATA that is corrected by the error correction circuit 411, the miscorrection detecting circuit 413 may enable and generate a; n alarm signal ALARM indicating the presence of the error in the read data DATA. The alarm signal ALARM may be transferred to the host. The generation of the miscorrection detecting code MIS_DET in the miscorrection detecting circuit 413 and the detection of a miscorrection based on the miscorrection detecting code MIS_DET may be carried out in the same method as that of FIG. 2.

The error correction circuit 411 may use an error correcting algorithm of a Reed Solomon (RS) scheme. The error correction circuit 411 may generate an error correction code ECC for correcting an error by using the write data DATA received from the host during a write operation and the miscorrection detecting code MIS_DET generated in the miscorrection detecting circuit 413. During the write operation, the write data DATA transferred from the host to the error correction circuit 411 may be the same as a write data DATA' transferred from the error correction circuit 411 to the memory module 420, and the miscorrection detecting code MIS_DET transferred from the miscorrection detecting circuit 413 to the error correction circuit 411 may be the same as a miscorrection detecting code MIS_DET' transferred from the error correction circuit 411 to the memory module 420.

The error correction circuit 411 may correct an error of a read data DATA' that is read from the memory module 420 and the miscorrection detecting code MIS_DET' that is read from the memory module 420 by using the error correction code ECC that is read from the memory module 420 during a read operation. The error correction circuit 411 may transfer the error-corrected read data DATA to the host and the miscorrection detecting circuit 413, and transfer the error-corrected miscorrection detecting code MIS_DET to the miscorrection detecting circuit 413. When the miscorrection detecting circuit 413 detects a miscorrection, that is, when the alarm signal ALARM is enabled, the error correction circuit 411 may assume one chip among the plurality of memory chips 421 to 441 is chip-killed and repeatedly perform an error correcting operation. This will be described later in detail with reference to FIG. 5.

As described above, in order to correct [6 bits of random errors and one chip-killed memory chip], the size of the parity may have to be 20 symbols (which are 160 bits). However, if it is possible to detect the chip-killed memory chip among the memory chips 421 to 441, that is, if the position of the chip-killed memory chip may be detected, the size of parity may be reduced. If there are errors whose positions are detected and errors whose positions are not detected mixed together, the number of parity bits, which is the size of the error correction code ECC, may be represented by the following Equation 2.

Parity bits=2*(Number of error-correctable symbols whose positions are not detected)+(Number of error-correctable symbols whose positions are detected) (2)

Hence, the number of parity bits for correcting the [6 bits of random errors and chip-killing errors when it is known which memory chip is chip-killed] calculated based on Equation 2, may come to 128 bits, which are 16 symbols (=2*(6 symbols)+(4 symbols)). This is shown in FIG. 4. In short, the error correction circuit 411 of FIG. 4 may generate the error correction code ECC having a size capable of correcting the [6 bits of random errors and one chip-killed memory chip whose position is detected].

The memory module 420 may include a plurality of memory chips, for example, 21 memory chips 421 to 441. Each of the memory chips 421 to 441 may be one among all kinds of memories, such as Dynamic Random Access Memory (DRAM), Phase-Change RAM (PCRAM), flash memory and the like. The memory module 420 may be a Dual In-Line Memory Module (DIMM). Each of the memory chips 421 to 441 may be able to store data of 32 bits during a one-time write operation, and output data of 32 bits during a one-time read operation. In 16 memory chips 421 to 436, data DATA' of 512 bits may be written and read, and in the other four memory chips 437 to 440, an error correction code ECC of 128 bits may be written and read. In the memory chip 441, an 8-bit miscorrection detecting code MIS_DET' may be written and read. In all the remaining 24 bits of the memory chip 441, '0' may be written and read. In short, the remaining 24 bits of the memory chip 441 may be zero-padded. In the memory chips 421 to 441 of FIG. 4, the information stored in the memory chips 421 to 441 is shown. Also, the memory chips 421 to 441 are given with reference numbers. The pattern that data DATA', the error correction code ECC, and the miscorrection detecting code MIS_DET' are distributed to the memory chips 421 to 441 does not have to be the same as the pattern shown in FIG. 4. The data DATA', the error correction code ECC, and the miscorrection detecting code MIS_DET' may be distributed to the memory chips 421 to 441 and stored therein.

Although FIG. 4 shows an example where the error correction circuit 411 and the miscorrection detecting circuit 413 are included in the memory controller 410, at least a part of them may be included in the memory module 420. Also, it should be obvious to those skilled in the art that the number of the memory chips that are included in the memory module 420 may be different from what is shown in FIG. 4, and that the numbers of the bits of the data DATA', the error correction code ECC, and the miscorrection detecting code MIS_DET may be different from what is shown in FIG. 4.

Also, although FIG. 4 shows an example where 1 symbol is formed of 8 bits, it is obvious to those skilled in the art that when 1 symbol is not formed of 8 bits, for example, when 1 symbol is formed of 7 bits or 6 bits, the number of bits of the error correction code ECC and the number of bits of the miscorrection detecting code MIS_DET may be different from what is shown in FIG. 4.

Figure 5:
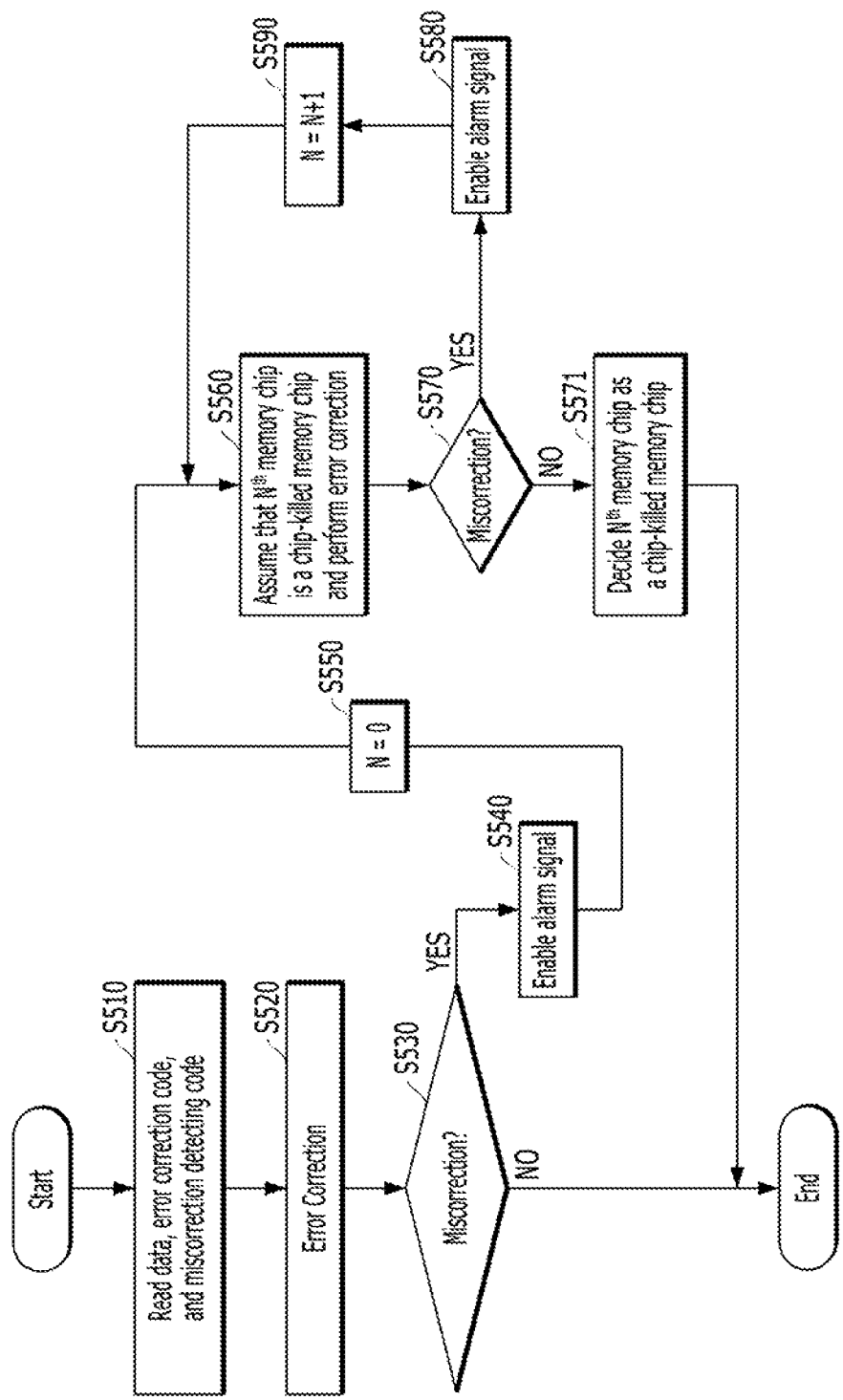
FIG. 5 is a flowchart illustrating an error correcting method in a memory system, in accordance with an embodiment of the present invention.

FIG. 5 is a flowchart illustrating an error correcting method in a memory system, in accordance with another embodiment of the present invention. The memory system may be, for example, the memory system 400 shown in FIG. 4.

Referring to FIG. 5, in step S510, the data DATA', the error correction code ECC, and the miscorrection detecting code MIS_DET' may be read from the memory chips 421 to 441. The read data DATA', error correction code ECC, and miscorrection detecting code MIS_DET' may be transferred to the memory controller 410.

In step S520, the error correction circuit 411 may correct errors in the data DATA' and the miscorrection detecting code MIS_DET' by using the error correction code ECC. The error correction circuit 411 may transfer the error-corrected data DATA to the host and the miscorrection detecting circuit 413, and transfer the error-corrected miscorrection detecting code MIS_DET to the miscorrection detecting circuit 413.

In step S530, the miscorrection detecting circuit 413 may detect whether there is a miscorrection or not in the data by using the miscorrection detecting code MIS_DET. Since the number of bits (i.e., 128 bits) of the error correction code ECC used in the memory system 400 is less than the number of bits (i.e., 160 bits) of the error correction code ECC used in the memory system 100 of FIG. 1, the miscorrection detecting circuit 413 may be able to detect a miscorrection even though 6 bits of random errors and one chip-killed memory chip occur.

When no miscorrection is detected ('No' in the step S530), the error correcting process may be finished.

When a miscorrection is detected ('Yes' in the step S530), the miscorrection detecting circuit 413 may enable and generate the alarm signal ALARM indicating that there is a miscorrection in the error-corrected data DATA in step S540. The alarm signal ALARM may be transmitted to the host. The error correcting process of FIG. 3 is finished herein, but the error correcting process of FIG. 5 may go on.

After the step S540, when N=0 in step S550, the error correction circuit 411 may assume or designate that an $N^{th}$ memory chip (which is the $0^{th}$ memory chip 421 in this case) is a chip-killed memory chip and correct errors of the data DATA' and the miscorrection detecting code MIS_DET' by using the error correction code ECC in step S560. The error correction circuit 411 may transfer the error-corrected read data DATA to the host and the miscorrection detecting circuit 413, and transfer the error-corrected miscorrection detecting code MIS_DET to the miscorrection detecting circuit 413.

The miscorrection detecting circuit 413 may be able to decide whether the data DATA that is corrected again in the step S560 based on the miscorrection detecting code MIS_DET is miscorrected in step S570.

When no miscorrection is detected ('No' in the step S570), the error correction circuit 411 may decide that the $N^{th}$ memory chip is a chip-killed memory chip in step S571, and the error correcting process may be finished. When the assumption on the chip-killed memory chip in the step S560 is correct, that is, when the $N^{th}$ memory chip 421 is a chip-killed memory chip, the miscorrection may not be detected in the step S570.

Since it is decided that the $N^{th}$ memory chip is a chip-killed memory chip in step S571, the error correction circuit 411 may perform the error correcting operation subsequently under the assumption that the memory chip which is decided as a chip-killed memory chip is a chip-killed memory chip.

When a miscorrection is detected ('Yes' in the step S570), in step S580, the miscorrection detecting circuit 413 may enable and generate the alarm signal ALARM indicating that there is a miscorrection in the data DATA whose error re-corrected is in the step S560. The alarm signal ALARM may be transmitted to the host. If the assumption on the chip-killed memory chip in the step S560 is incorrect, that is, if another memory chip which is not the $N^{th}$ memory chip is a chip-killed memory chip, a miscorrection may be detected in the step S570.

The processes of the step S560 to S580 may be performed again by increasing the number of N by 1 in step S590. This process may be repeated until no miscorrection is detected. When there is a miscorrection detected continuously, the processes of the step S560 to S590 may be performed repeatedly until the value of N reaches a predetermined value (e.g., 20). If a miscorrection is detected even when the value of N reaches 20, it may be a case where more errors than [6 bits of random errors and one chip-killed memory chip] occur. In this case, error correction fails.

Referring to FIGS. 4 and 5, it may be seen that the memory system 400 uses an error correction code ECC having a number of bits that is less than the number of the bits of the error correction code ECC used in the memory system 100 but the memory system 400 retains the same error correction capability as that of the memory system 100 by assuming that, when a miscorrection is detected, one among the memory chips 421 to 441 is a chip-killed memory chip and repeatedly performing an error correcting operation. Since the memory system 400 repeatedly performs the error correcting operation by changing the memory chip that is assumed as a chip-killed memory chip, it may take a long time to detect a chip-killed memory chip and correct errors. However, once the chip-killed memory chip is decided, the memory system 400 may be able to assume that the memory chip decided as a chip-killed memory chip is a chip-killed memory chip and perform the error correcting operation right away. Therefore, time delay may not be caused any more.

Also, for reducing the detection time for detecting a chip-killed memory chip when a miscorrection occurs, the memory system can employ a plurality of error correction circuits in the memory controller 410, and the multiple error correction circuits may assume different memory chips as chip-killed memory chips and perform the operation in parallel. In this way, the memory system is able to detect a chip-killed memory chip quickly.

According to the embodiments of the present disclosure, error correction efficiency of a memory system may be increased.

While the present disclosure has been described with respect to the specific embodiments, it will be apparent to those skilled in the art that various changes and modifications may be made without departing from the spirit and scope of the invention as defined in the following claims.

What is claimed is:

1. An error correcting method of a memory system, comprising:
    reading data, an error correction code, and a miscorrection detecting code from a plurality of memory chips;
    correcting an error of the data based on the error correction code;
    determining whether or not a miscorrection occurs in the correcting of the error of the data based on the miscorrection detecting code;
    designating one memory chip among the plurality of the memory chips as a chip-killed memory chip when a miscorrection occurs;
    re-correcting the error of the data based on the error correction code in consideration of the designated chip-killed memory chip; and
    re-determining whether a miscorrection occurs in the re-correcting of the error of the data based on the miscorrection detecting code,
    wherein when a miscorrection is detected in the re-determining of whether the miscorrection occurs or not, the memory chip that is designated as the chip-killed memory chip among the plurality of the memory chips is changed with another memory chip, and then the re-correcting of the error of the data and the re-determining of whether the miscorrection occurs are repeated.

2. The error correcting method of claim 1, further comprising, when a miscorrection is not detected in the deciding of whether the miscorrection occurs or not, ending the error correcting process.

3. The error correcting method of claim 2, further comprising, when a miscorrection is not detected in the re-determining of whether the miscorrection occurs or not, determining the memory chip, that is designated as the designated chip-killed memory chip, as a chip-killed memory chip, and ending an error correcting process.

4. The error correcting method of claim 1, wherein the error correction code includes one of an error correction code of a Reed Solomon (RS) scheme, an error correction code of a Bose-Chaudhuri-Hocquenghem (BCH) scheme and an error correction code of a Turbo scheme.

5. The error correcting method of claim 1, wherein the error correction code is a Reed Solomon (RS) scheme.

6. A memory system, comprising:
a plurality of memory chips suitable for storing data, an error correction code, and a miscorrection detecting code;
an error correction circuit suitable for reading the data and the error correction code from the plurality of the memory chips, and correcting an error of the data based on the error correction code; and
a miscorrection detecting circuit suitable for detecting whether a miscorrection occurs or not in the error correction circuit based on the miscorrection detecting code,
wherein when the miscorrection detecting circuit detects a miscorrection of the error correction circuit, the error correction circuit designates one memory chip among the plurality of the memory chips as a chip-killed memory chip and re-corrects the error of the data based on the error correction code in consideration of the designated chip-killed memory chip,
wherein the error correction circuit performs an error correcting operation repeatedly by changing the memory chip which is designated as the chip-killed memory chip with another memory chip among the plurality of the memory chips, until no miscorrection is detected.

7. The memory system of claim 6, wherein the error correction code includes one of an error correction code of a Reed Solomon (RS) scheme, an error correction code of a Bose-Chaudhuri-Hocquenghem (BCH) scheme and an error correction code of a Turbo algorithm.

8. The memory system of claim 6, wherein the error correction circuit designates a particular memory chip among the plurality of the memory chips as a chip-killed memory chip and, when no miscorrection is detected, decides the particular memory chip as a chip-killed memory chip.

9. The memory system of claim 6, wherein the error correction circuit and the miscorrection detecting circuit are included in a memory controller, and
the plurality of the memory chips are included in a memory module.

10. The memory system of claim 6, wherein the memory system is capable of correcting errors in a case that N random errors (where N is an integer equal to or greater than '1') occur in the plurality of the memory chips and one memory chip among the plurality of the memory chips is a chip-killed memory chip.

11. The memory system of claim 10, wherein the number of bits of the error correction code used in the memory system is less than the number of bits of the error correction code required to correct the errors in the case that N random errors (where N is an integer equal to or greater than '1') occur in the plurality of the memory chips and one memory chip among the plurality of the memory chips is the chip-killed memory chip, without the memory system designating one memory chip among the plurality of the memory chips as a chip-killed memory chip.

\* \* \* \* \*